(12) United States Patent
Khoshnood et al.

(10) Patent No.: US 12,089,339 B2
(45) Date of Patent: Sep. 10, 2024

(54) INTELLIGENT SURFACE MOUNT TECHNOLOGY REEL STORAGE SYSTEM

(71) Applicants: Bahman Khoshnood, Deerfield Beach, FL (US); Harvey Bruce Altman, Delray Beach, FL (US); Brandon James Nolan, Boca Raton, FL (US)

(72) Inventors: Bahman Khoshnood, Deerfield Beach, FL (US); Harvey Bruce Altman, Delray Beach, FL (US); Brandon James Nolan, Boca Raton, FL (US)

(73) Assignee: INOVAXE CORPORATION, Deerfield Beach, FL (US)

( * ) Notice: Subject to any disclaimer, the term of this patent is extended or adjusted under 35 U.S.C. 154(b) by 65 days.

(21) Appl. No.: 17/948,900

(22) Filed: Sep. 20, 2022

(65) Prior Publication Data

US 2024/0098956 A1   Mar. 21, 2024

(51) Int. Cl.
| | |
|---|---|
| *B65G 1/137* | (2006.01) |
| *G06Q 10/087* | (2023.01) |
| *G08B 5/36* | (2006.01) |
| *H05K 13/00* | (2006.01) |
| *H05K 13/02* | (2006.01) |

(52) U.S. Cl.
CPC ....... *H05K 13/0084* (2013.01); *B65G 1/1371* (2013.01); *G06Q 10/087* (2013.01); *G08B 5/36* (2013.01); *H05K 13/021* (2013.01); *B65G 2201/0232* (2013.01)

(58) Field of Classification Search
CPC .. H05K 13/0084; H05K 13/021; H05K 13/08; B65G 1/1371; B65G 2201/0232; G08B 5/36; A47F 1/12; A47F 5/108; A47F 7/005; A47F 7/144; A47F 2010/005; A47F 2003/066; A47F 3/063; A47F 3/004
USPC ........ 211/59.2, 40; 340/5.92, 5.1, 5.61, 5.64
See application file for complete search history.

(56) References Cited

U.S. PATENT DOCUMENTS 3,338,421 A * 8/1967 Lyman ...................... A47F 7/00
                                                     211/41.12
3,710,900 A * 1/1973 Fink ........................ A45C 13/02
                                                     190/110

(Continued)

FOREIGN PATENT DOCUMENTS

| MY | 185495 A | * | 5/2021 | ............... A47F 1/00 |
| WO | WO-2016138523 A1 | * | 9/2016 | ............... A47F 1/00 |
| WO | WO-2018189699 A1 | * | 10/2018 | ......... H05K 13/0084 |

*Primary Examiner* — Jennifer E. Novosad (74) *Attorney, Agent, or Firm* — Malloy & Malloy, P.L.; Robert M. Downey (57) ABSTRACT

Intelligent storage trays each hold SMT (Surface Mount Technology) reels of varying width without the need for separating dividers between the reels. An arrangement of light pipes within the tray pivot so that either one or multiple light pipes are pushed back to a closed position when an SMT reel is placed in the tray. Sensors detect movement of the light pipes allowing software to automatically assign a single SMT reel storage location to all of the light pipes that were moved by the SMT reel placement. Beacons on the tray indicate actions needed to take place and compression contacts on the tray communicate with the storage system software when the tray is placed and removed from a holder, such as a cart. Spring pins lock the tray into place within the holder allowing for ease of placement and removal.

10 Claims, 15 Drawing Sheets

(56) References Cited

U.S. PATENT DOCUMENTS

| | | | | |
|---|---|---|---|---|
| 4,720,153 | A * | 1/1988 | Hatcher | G11B 23/0236 312/9.53 |
| 4,782,958 | A * | 11/1988 | Price | G11B 23/0236 211/41.12 |
| 5,139,320 | A * | 8/1992 | Banker | A47B 87/0276 312/9.19 |
| 5,265,740 | A * | 11/1993 | Hodsden | A47B 57/08 211/187 |
| 5,341,944 | A * | 8/1994 | Latino | A47B 81/068 211/94.01 |
| 5,908,118 | A * | 6/1999 | Tyler | G11B 23/0236 211/41.12 |
| 6,234,328 | B1 * | 5/2001 | Mason | A47F 5/0037 248/242 |
| 6,446,817 | B1 * | 9/2002 | Stitt | G11B 23/02 211/41.12 |
| 7,762,410 | B2 * | 7/2010 | Colin | A47F 5/10 211/187 |
| 9,549,493 | B2 * | 1/2017 | Youngquist | H05K 13/0409 |
| 10,045,636 | B2 * | 8/2018 | Khoshnood | G06Q 10/08 |
| 10,111,369 | B2 * | 10/2018 | Jacobsson | H05K 13/0084 |
| 10,694,646 | B2 * | 6/2020 | Jacobsson | H05K 13/0084 |
| 10,820,459 | B2 * | 10/2020 | Kondo | H05K 13/08 |
| 10,956,857 | B2 * | 3/2021 | Jacobsson | G06Q 10/087 |
| 2003/0046808 | A1 * | 3/2003 | Eskang | H05K 13/0417 29/650 |
| 2003/0156427 | A1 * | 8/2003 | Robey | B65G 1/1373 362/555 |
| 2003/0156428 | A1 * | 8/2003 | Robey | B65G 1/1373 362/555 |
| 2004/0088229 | A1 * | 5/2004 | Xu | B65G 1/137 705/28 |
| 2008/0217394 | A1 * | 9/2008 | Okada | H05K 13/086 235/375 |
| 2013/0264917 | A1 * | 10/2013 | Baptiste | E05B 65/462 29/428 |
| 2016/0212899 | A1 * | 7/2016 | Jacobsson | H05K 13/0404 |
| 2024/0098956 | A1 * | 3/2024 | Khoshnood | G06Q 10/087 |

* cited by examiner

INTELLIGENT SURFACE MOUNT TECHNOLOGY REEL STORAGE SYSTEM

FIELD OF THE INVENTION

The invention relates to an intelligent inventory storage system for electronic parts and components and, more particularly, to an intelligent inventory storage system for storing SMT (Surface Mount Technology) reels and tracking location of the reels and inventory of electronic parts and components stored on the reels.

DESCRIPTION OF THE RELATED ART

Electronic manufacturers and distributors typically have thousands of electronic parts and components that they need to store for future retrieval during manufacturing. Most commonly, electronic components and parts such as, but not limited to, capacitors, resistors and integrated circuits are initially packaged on a tape that is wound on a reel, commonly known as an SMT (Surface Mount Technology) reel. Storing and retrieving parts and packages from SMT reel inventory is often challenging and labor intensive. Also, the accuracy of the inventory is critical to the efficiency of a company's operation. U.S. Pat. No. 10,045,636 discloses an intelligent inventory storage system that reduces the amount of labor and space that is required to store and retrieve the electronic components needed in a company's operation and allows for more accurate count of the electric parts and components in inventory. According to the intelligent inventory storage system disclosed in U.S. Pat. No. 10,045,636, the contents of which are incorporated herein by reference, storage racks are designed to hold specifically sized (i.e., width) SMT reels within a slot. The slots are designed to fit tightly to the SMT reels that are intended to be placed within that particular slot to minimize waste of storage space. When purchasing the intelligent inventory storage system, a customer must specify what type of SMT reels they have and intend to store in the storage racks because the racks are provided with rigid dividers forming reel storage slots that are sized to receive SMT reels of a particular width that corresponds to the slot size or that is smaller than the slot size. Otherwise, one or more dividers must be removed to accommodate a wider width SMT reel. This involves reconfiguring the software to assign two or more locations as one SMT reel slot location. The use of the rigid dividers in the storage racks is cumbersome for users and creates process slowdowns. Moreover, it is difficult to predict the capacity that is required to accommodate all SMT reels of varying width in a single reel smart location storage system.

The present invention improves upon the intelligent inventory storage system of U.S. Pat. No. 10,045,636 by allowing SMT reels of varying width to be stored in an intelligent SMT reel storage tray without any physical storage structure or hardware modification. More particularly, the intelligent SMT reel storage system of the present invention provides for an intelligent storage tray that eliminates the need for dividers between reels, while accommodating SMT reels of varying width typically ranging between 8 mm up to 72 mm in width.

SUMMARY OF THE INVENTION

An intelligent inventory storage system includes a number of individual intelligent storage trays that are removably supported within a holder, such as a cart. Each intelligent storage tray is structured for holding as many as 46 SMT reels including reels of varying width without the need for dividers between the stored SMT reels. An arrangement of light pipes are pivotally supported within each of the intelligent storage trays. One or multiple light pipes are pushed back to a closed position when an SMT reel is placed in the tray. Depending upon the width of the SMT reel, either one light pipe, or multiple light pipes will engage the SMT reel and are pushed back to the closed position to define a single reel storage position within the tray. Sensors within the intelligent storage tray detect movement of the light pipes, thereby allowing software to automatically assign the single SMT reel storage location to all of the light pipes that were moved by the SMT reel placement. Each tray has beacons on opposite sides to indicate actions needed to take place in that particular intelligent storage tray. Each intelligent storage tray further includes a compression contact that communicates with the storage system software when the tray is placed and removed from the holder, such as a cart. Spring pins lock the tray into place within the holder, allowing for ease of placement and removal of the trays from the holder.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE PREFERRED EMBODIMENT

Figure 1:
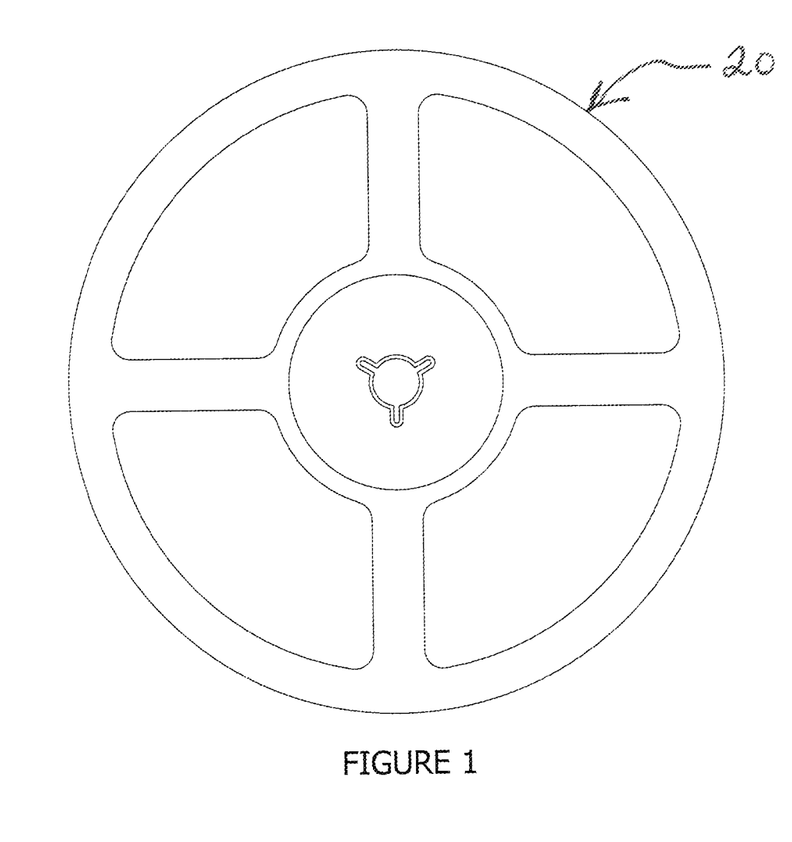
FIG. 1 is a side elevational view of a typical SMT reel.
Figure 2:
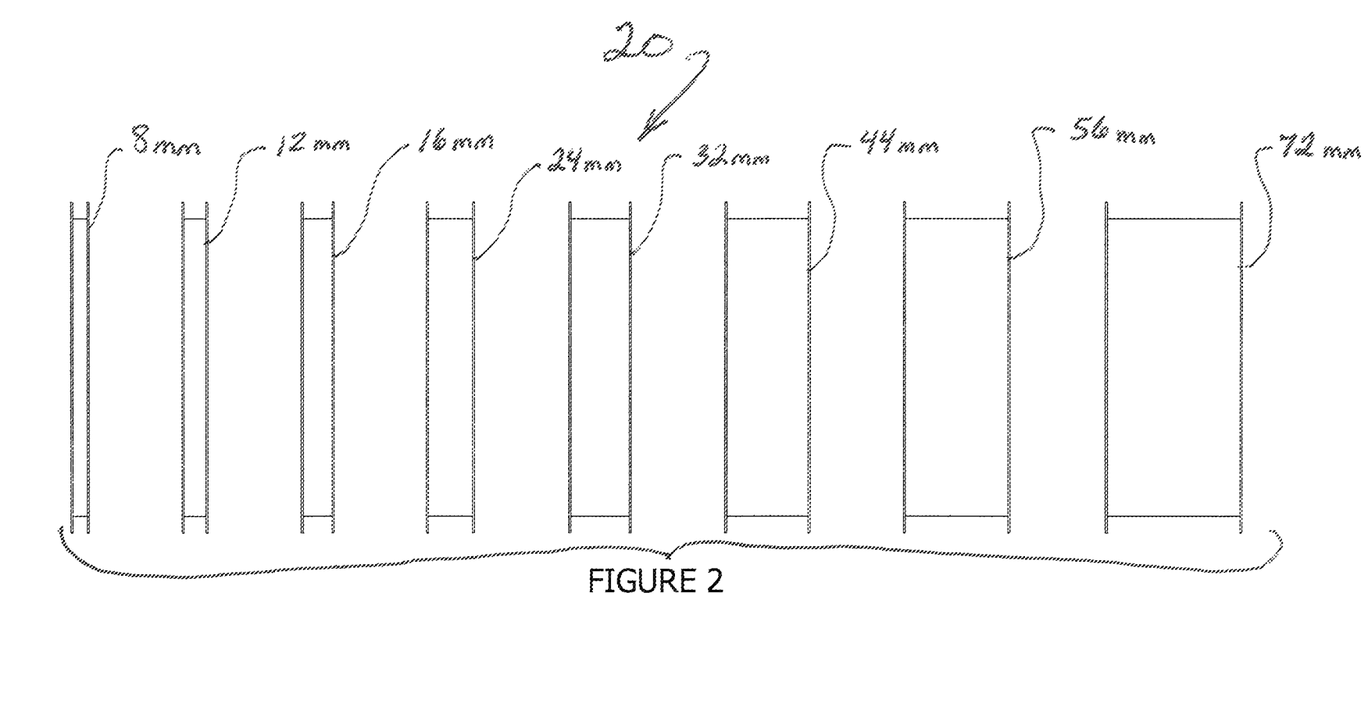
FIG. 2 is a front elevational view showing an arrangement of SMT reels of varying width.

The electronic components, such as capacitors, resistors and integrated circuits are typically packaged on a tape that is wound about a reel, commonly known as an SMT (Surface Mount Technology) reel 20, as seen in FIGS. 1 and 2. The SMT reels 20, often referred to as packages, can typically contain between 5,000 and 10,000 electronic pieces per SMT reel. SMT reels 20 can be of different widths, for example: 8 mm; 12 mm; 16 mm; 24 mm; 32 mm; 44 mm; 56 mm; and 72 mm, as shown in FIG. 2.

Figure 3:
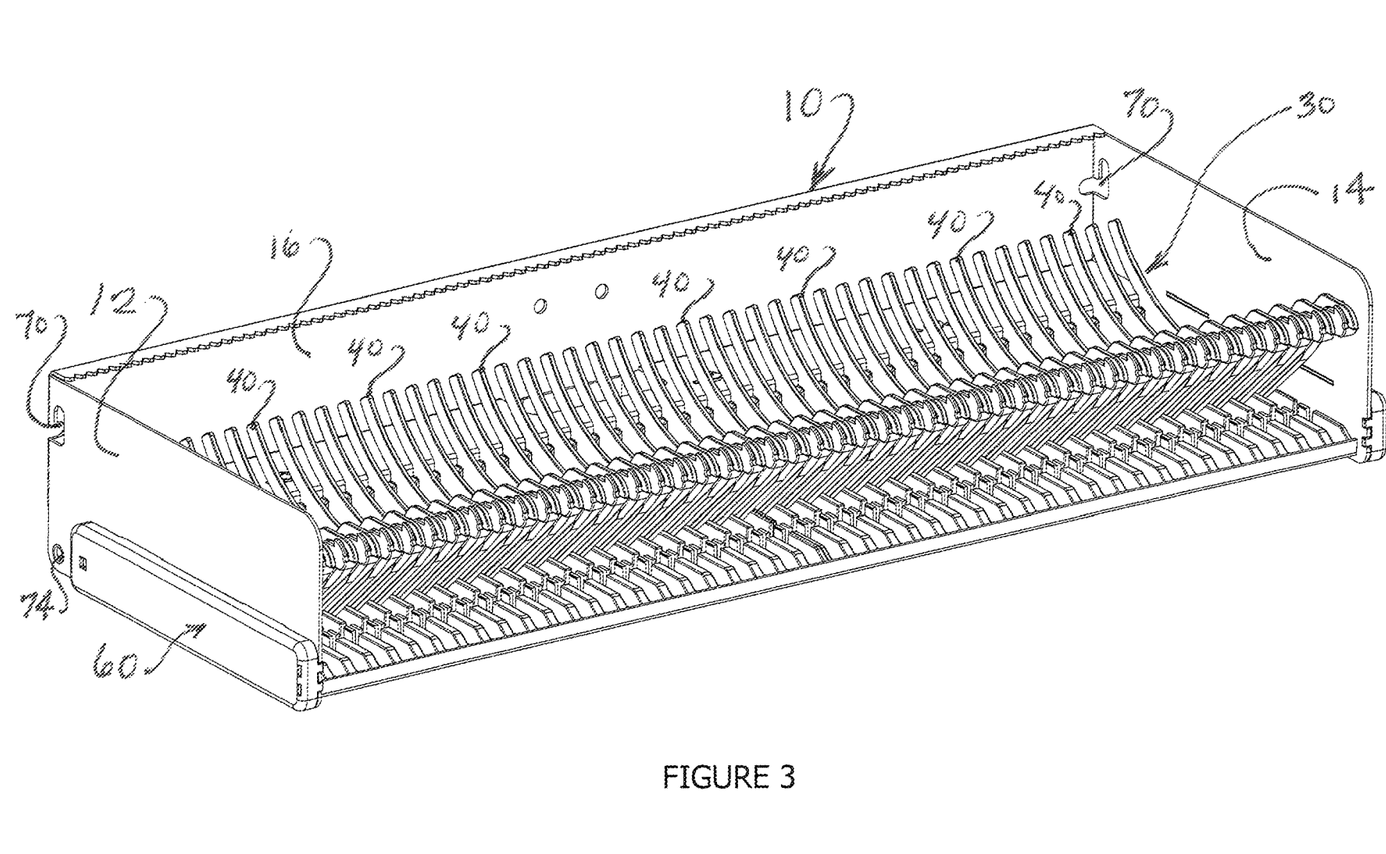
FIG. 3 is a front, top perspective view of the intelligent storage tray of the present invention shown fully assembled including an arrangement of light pipe assemblies within the tray and tray beacons on opposite ends of the tray.
Figure 4:
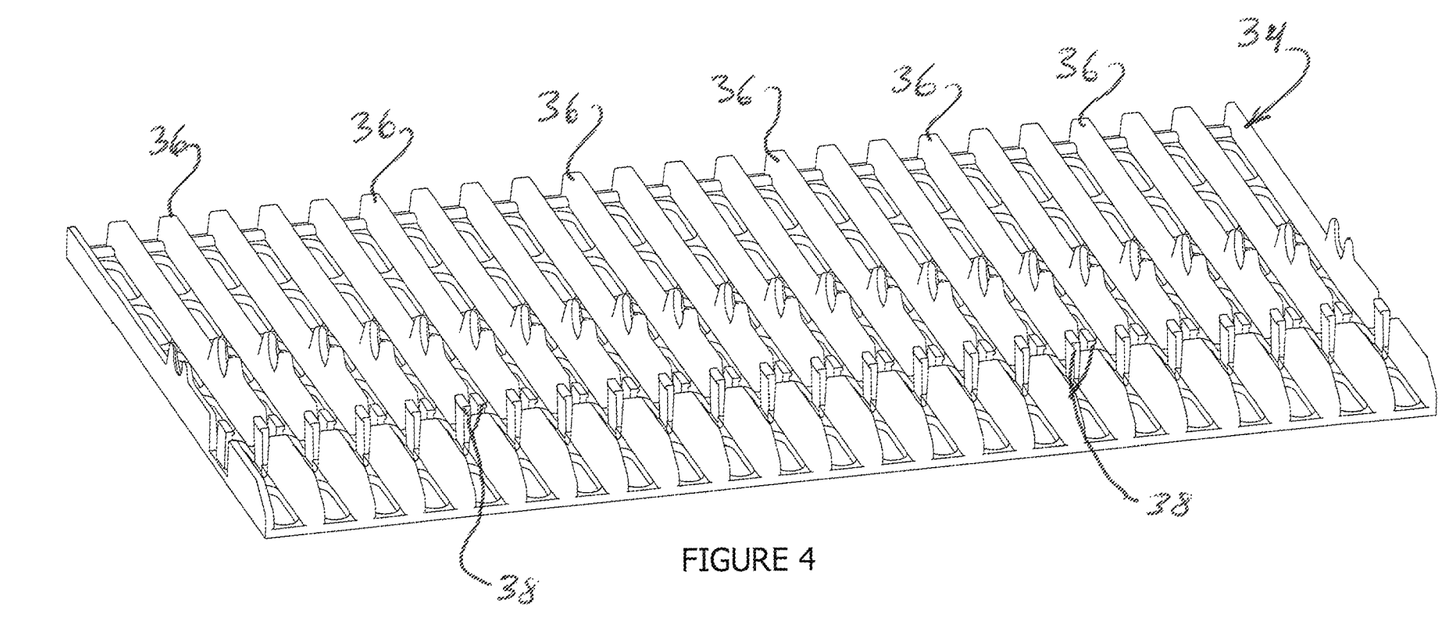
FIG. 4 is an isolated top perspective view of spacers that are positioned within the intelligent storage tray for pivotally supporting the arrangement of light pipes.
Figure 5:
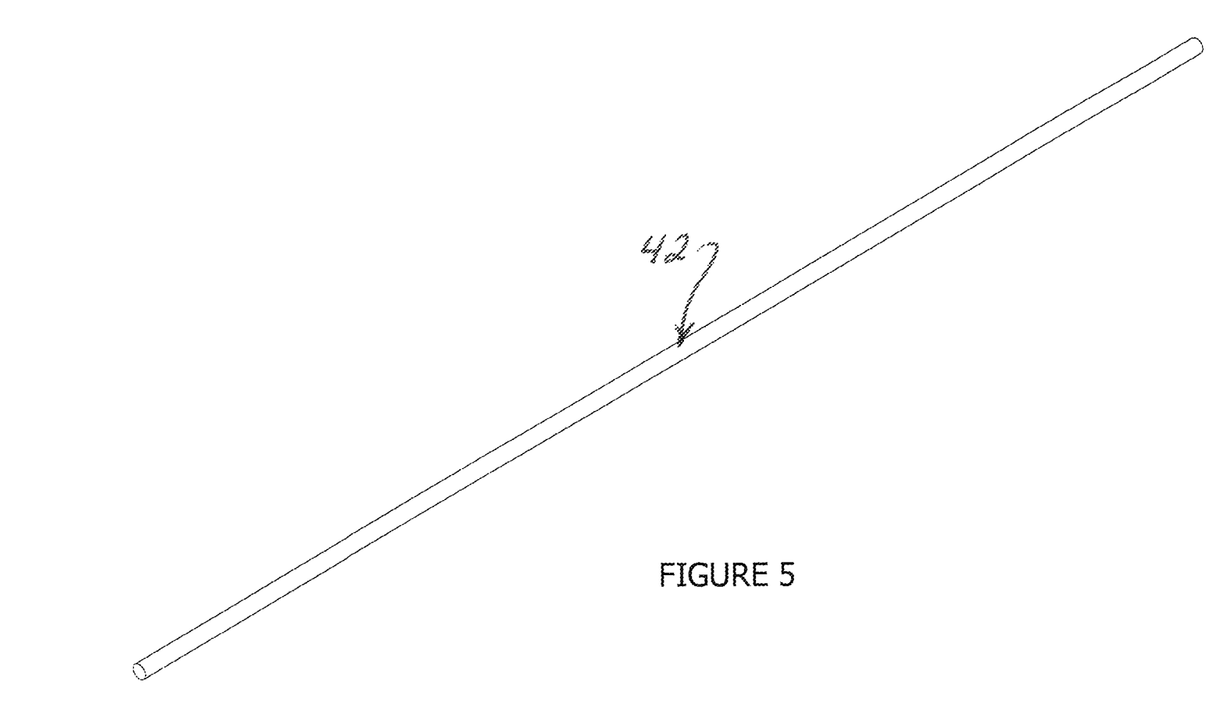
FIG. 5 is an isolated perspective view of a rod that is fitted to the spacers and through each of the light pipes for pivotally supporting the light pipes on the spacers.
Figure 6:
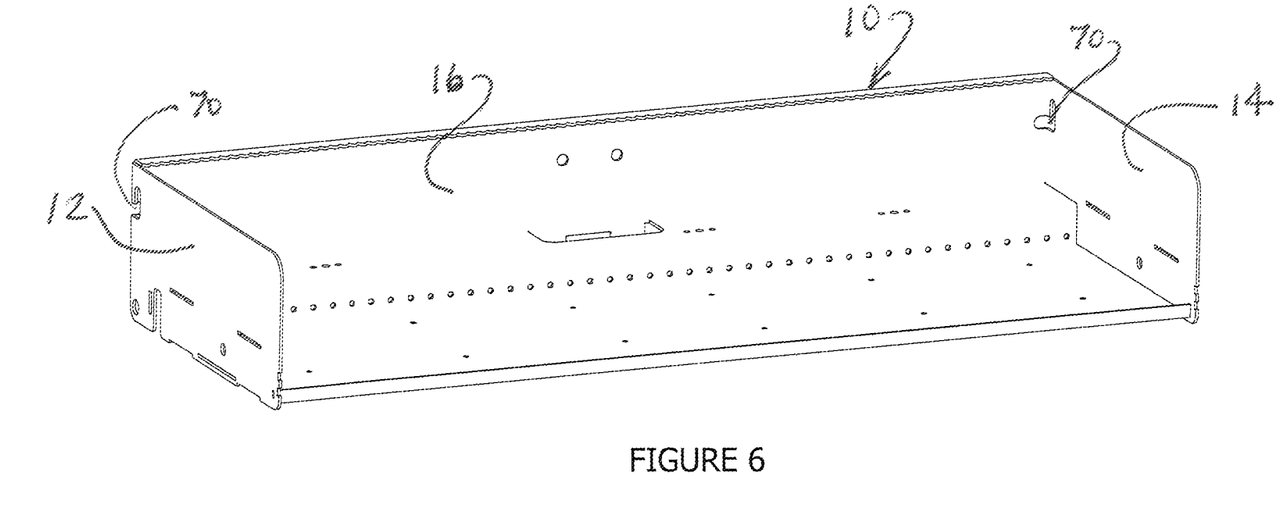
FIG. 6 is a front, top perspective view of the intelligent storage tray with all components removed.

The intelligent storage tray 10 of the present invention is specifically structured and designed to store SMT reels 20 of various widths without allowing the reels 20 to fall over on their sides, but instead, maintaining the various width SMT reels 20 neatly stored in an upright position with little to no space between adjacent SMT reels 20. The tray 10 is fitted with a light pipe assembly 30 that includes an arrangement of light pipes 40, as seen in FIG. 3. The light pipes 40 are pivotally supported on a rod 42 (see FIGS. 5, 7 and 8) that is fitted to a base 34 having an arrangement of parallel members 36 for maintaining the light pipes 40 in parallel, side by side arrangement, as seen in FIG. 3.

Figure 7:
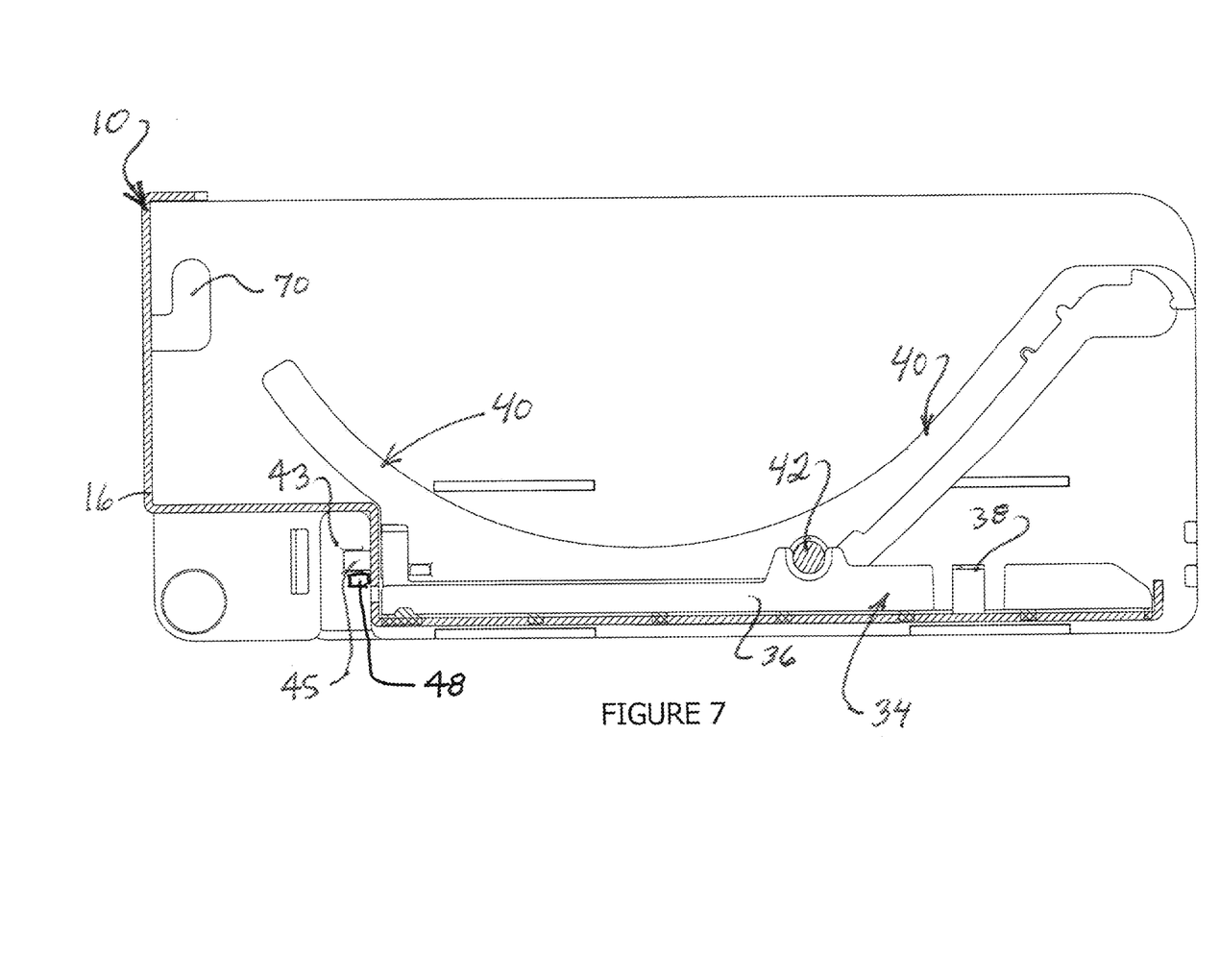
FIG. 7 is a side elevational view of the intelligent storage tray shown in cross-section and showing a light pipe in a closed position.
Figure 8:
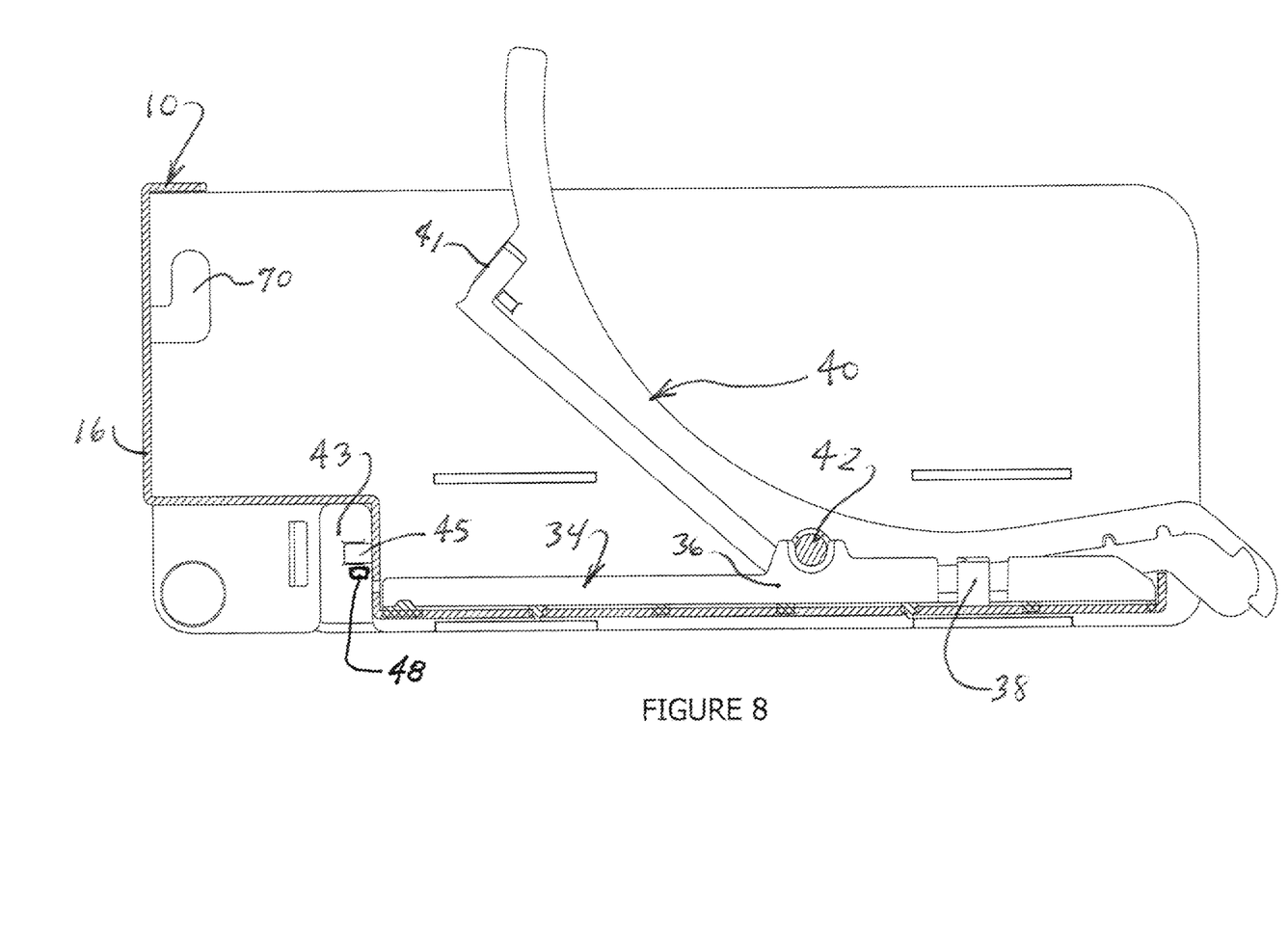
FIG. 8 is a side elevational view of the intelligent storage tray in partial cross-section and showing the light pipe in an open position.
Figure 9:
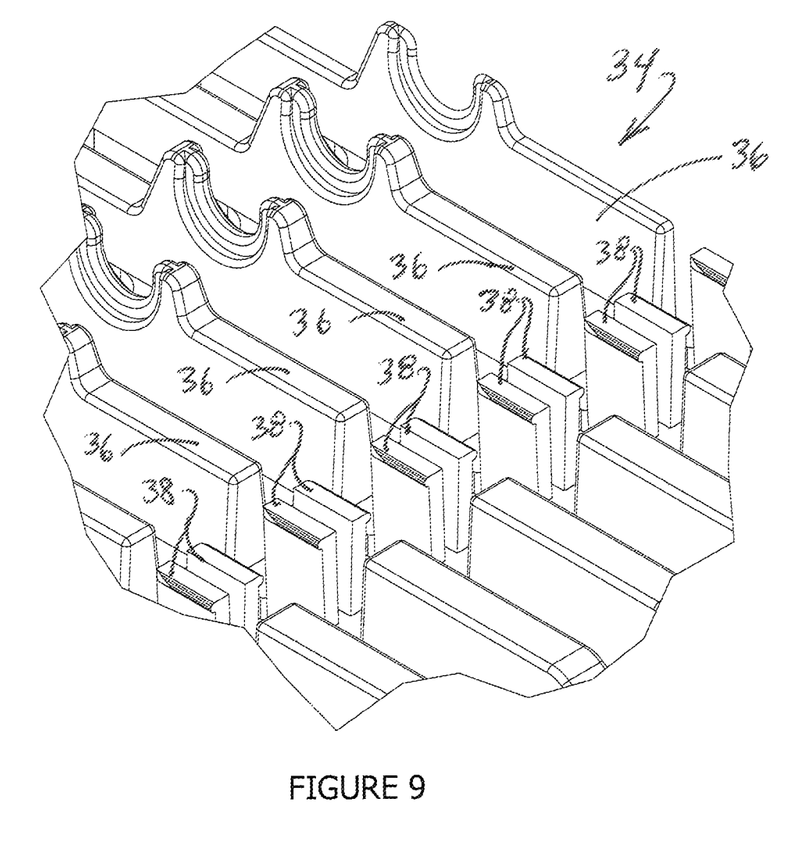
FIG. 9 is an isolated, enlarged perspective view of a locking system on the spacer assembly for allowing the light pipes to pivot on the rod and releasably lock in the closed position.
Figure 10:
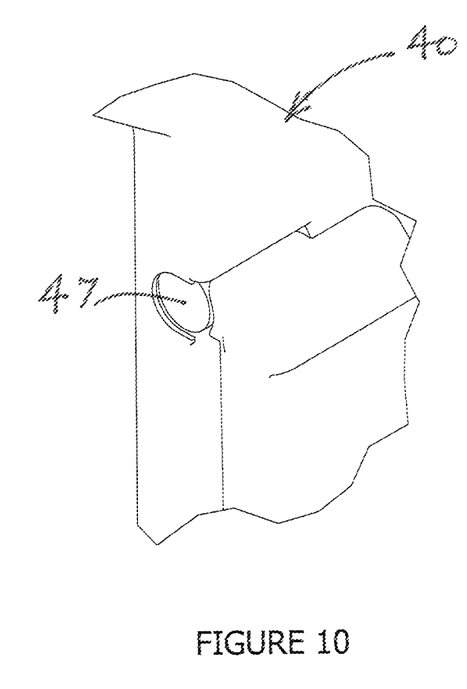
FIG. 10 is an isolated, cutaway perspective view of a magnet located inside a light pipe of the present invention.
Figure 11:
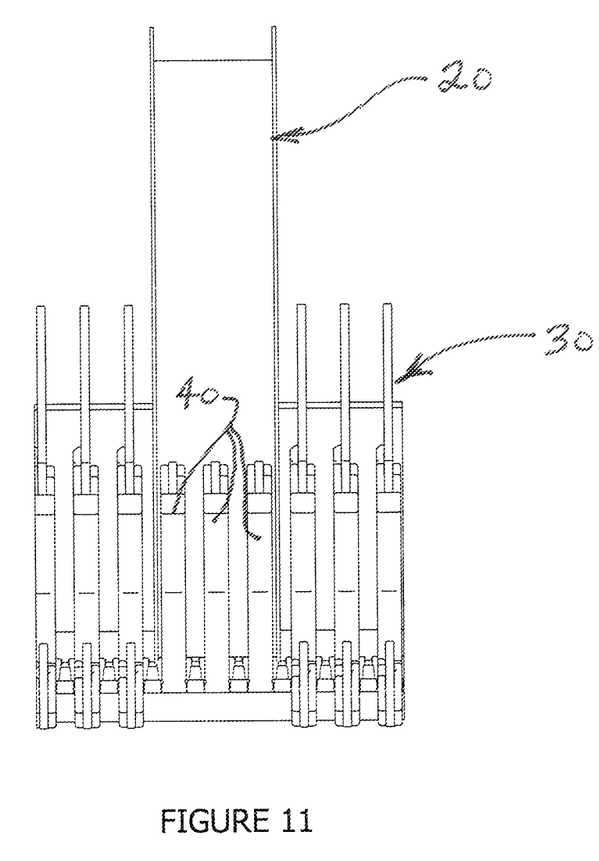
FIG. 11 is an isolated front elevational view of a portion of the interior of the intelligent storage tray showing a wide SMT reel supported upright within the tray on three light pipes to define a single reel storage position using the three light pipes.
Figure 12:
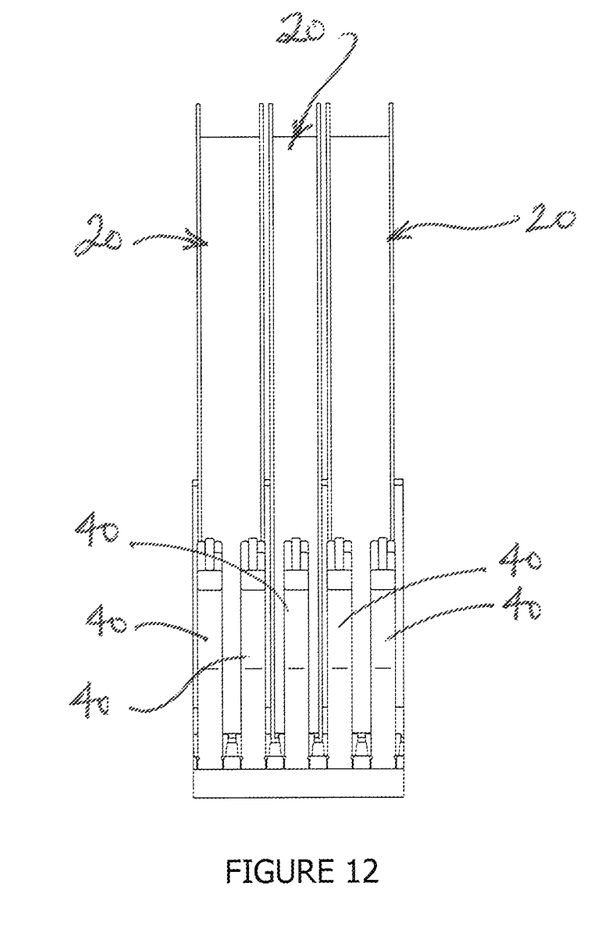
FIG. 12 is an isolated front elevational view of the interior of the intelligent storage tray showing three SMT reels supported within the tray, with a center one of the SMT reels having a width that is supported on a single light pipe, and SMT reels on opposing sides of the center SMT reel having a wider width and each being supported on two light pipes within the storage tray.

Each SMT reel 20 is held on one or more light pipes 40, depending upon the width of the SMT reel 20. The one or more light pipes 40 cradle the SMT reel 20, so that the SMT reel 20 is held in the desired upright position. Each of the light pipes 40 pivots between two states, an open state, as seen in FIG. 8, and a closed state, as seen in FIG. 7. When assembled on the base member 36 within the tray 10, each light pipe 40 serves four purposes. The first purpose is to aid the operator in placing the SMT reel 20 into the tray. Placing an SMT reel into the tray is accomplished by resting the SMT reel 20 against the back end of one or more light pipes 40, thus disengaging the locking system 38 on the base member 36 and allowing the light pipe 40 to pivot on the rod 42 until the light pipe reaches the closed state, as seen in FIG. 7. When a light pipe 40 is moved to the closed state, a magnet 47 located inside of the light pipe 40 activates a magnetic hall sensor 48 located on the tray's PC board 43, thus fulfilling the light pipes second purpose. The third purpose of the light pipe 40 is to direct light from an LED 45 that is located on the tray's PC board 43. The light directed from the LED 45 through the light pipe 40 indicates one or more operator's multiple job statuses, as well as the status of a reel 20. The fourth purpose of the light pipe 40 is to act as a vertical surface for adjacently placed SMT reels 20, thus keeping each SMT reel 20 upright. When an SMT reel 20 is placed next to a light pipe 40 in the closed position, the adjacent SMT reel in the closed light pipe will act as the vertical surface keeping the newly placed SMT reel 20 upright.

Figure 13:
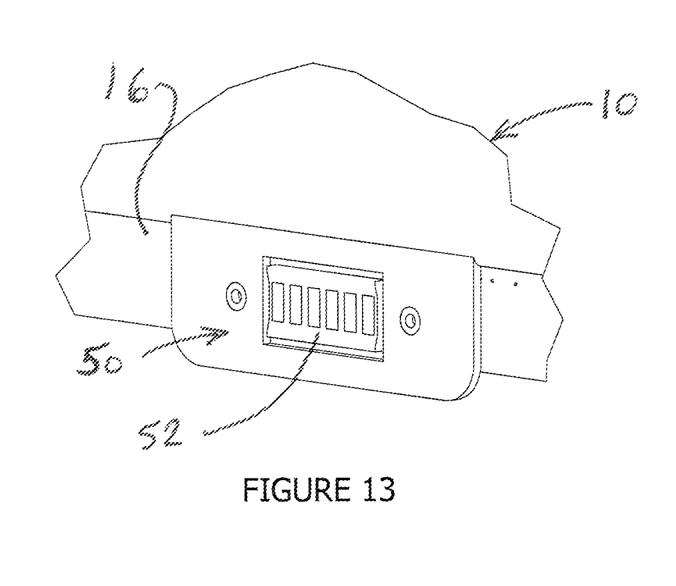
FIG. 13 is an isolated cutaway perspective view showing a PC board mounted on the rear of the intelligent storage tray.

As seen in FIGS. 7 and 8, the PC board 43 is mounted towards the back of the tray 10, behind the light pipes 40. Additionally, there is an LED 45 positioned behind each of the light pipes, for alignment with the back end 41 of the corresponding light pipe 40 when in the closed state (FIG. 7). When one or more light pipes 40 is moved to the closed state, the magnet 47 in the light pipe is detected by the PC board 43 behind the light pipe 40 in order to drive operation of the LEDs 45. This PC board 43 utilizes common circuitry for driving LEDs and sensing magnetic hall effect sensors such as in U.S. Pat. No. 10,045,636. This PC board 43 communicates to other processors in the system via a compression contact 52 located on a separate PC board 50 that is mounted on the outside of the back wall 16 of the tray, as seen in FIG. 13. The use of a compression style connector/contact 52 eliminates the need for any further actions to be taken in order to engage power and data connection. Additionally, the PC board 43 can sense the magnets 47 located within the light pipes 40 and then, using both the LEDs 45 and the light pipes' optical characteristics (as disclosed in U.S. Pat. No. 10,045,636) the status of each SMT reel 20 can be visually indicated to the operator. For example, when an SMT reel 20 is placed into the tray 10, the LEDs 45 corresponding to all of the light pipes 40 that the SMT reel 20 moved to the closed position will blink multiple times to indicate a successful placement of the SMT reel 20 within the tray 10 and on the one or more light pipes 40. On the other hand, when an SMT reel 20 is removed from the tray 10, causing the one or more light pipes 40 to pivot to the open state, the magnetic hall effect sensor(s) will detect a change in the magnetic field and report the removal of the corresponding SMT reel 20 to the processors in the system.

Figure 14:
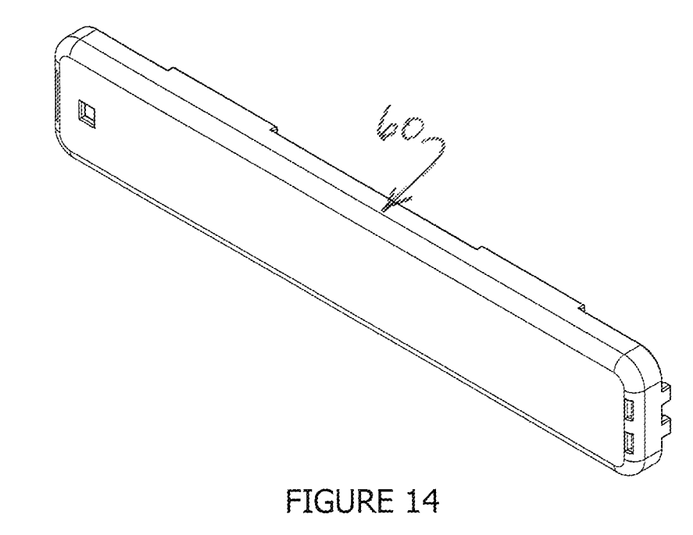
FIG. 14 is an isolated perspective view of a tray beacon that is mounted on each end of the tray, as seen in FIG. 1.

On the left 12 and right 14 sides of the tray 10 there is a tray beacon 60. When the corresponding LED 45 on the PC board 43 is activated, the tray beacon 60 will illuminate, thus indicating to the user that an action is required on that particular tray 10. Additionally, the tray beacons 60 will act as holding points for when the user is moving the tray 10 from one location to another location.

Figure 15:
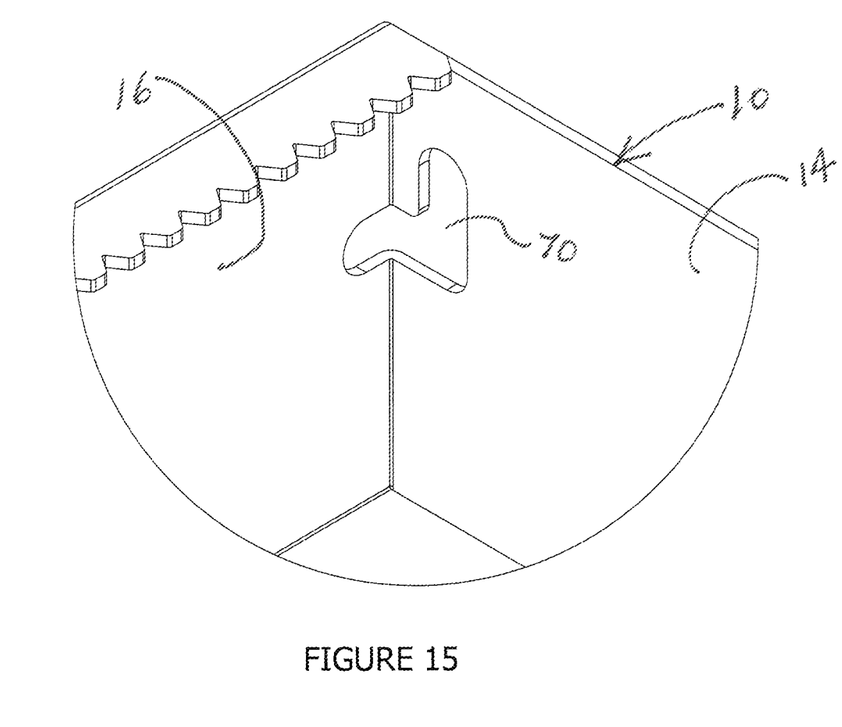
FIG. 15 is an isolated perspective view of an interior corner of the intelligent storage tray showing an opening for receiving a socket head screw on a holder for the tray.

Slots 70 are provided on the upper, rear corners of the tray 10 that allow the tray to rest on two socket head screws. The socket head screws are fitted to the holder for the tray 10, such as a cart. When the user places the tray 10 on these two socket head screws, the tray 10 will then drop until two spring loaded pins 74 on either side of the tray engage within holes in the tray holder, such as the cart.

Since many modifications, variations and changes in detail can be made to the described embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. An intelligent inventory storage system for storing and retrieving parts and components packaged on SMT reels, said system comprising:
   at least one intelligent storage tray having a bottom, opposite side walls and a back wall;
   a plurality of light pipes pivotally supported in the intelligent storage tray, and each of the plurality of light pipes including a receiving end and a light emitting end, and each of the plurality of light pipes being pivotally movable between an open state and a closed state;
   a plurality of LEDs each positioned adjacent to the receiving end of a correspondingly aligned one of the plurality of light pipes;

the receiving end of each of the plurality of light pipes being structured for entry of light therethrough emitted from the adjacent one of the plurality of LEDs when the light pipe is in the closed state for transmission to the light emitting end of the light pipe to indicate a status of the SMT reel;

a plurality of sensors for detecting movement of the plurality of light pipes between the open state and the closed state, and the plurality of sensors communicating with system software for assigning a single SMT reel storage location to all of the light pipes that are moved from the open state to the closed state by placement of a single SMT reel on one or more of the light pipes;

at least one beacon on the at least one intelligent storage tray for indicating actions needed to be taken in connection with the at least one intelligent storage tray; and a printed circuit board on the at least one intelligent storage tray for controlling operation of the plurality of LEDs and communicating with the plurality of sensors.

2. The intelligent inventory storage system as in claim 1 further comprising:
at least one computer processor for communicating with the printed circuit board on the at least one intelligent storage tray.

3. The intelligent inventory storage system as in claim 2 further comprising:
at least one compression contact on the at least one intelligent storage tray for connecting the printed circuit board, the plurality of LEDs and the plurality of sensors to a power supply and a data connection to the at least one processor.

4. The intelligent inventory storage system as in claim 3 wherein the compression contact is operated to connect the printed circuit board, the plurality of LEDs and the plurality of sensors to the power supply and data connection upon placement of the at least one intelligent storage tray within a holder.

5. The intelligent inventory storage system as in claim 4 further comprising:
at least two spring pins on the opposite side walls of the at least one intelligent storage tray for locking the at least one intelligent storage tray to the holder.

6. An intelligent inventory storage system for storing and retrieving parts and components packaged on SMT reels, said system comprising:
at least one intelligent storage tray having a bottom, opposite side walls and a back wall;
a plurality of reel holders pivotally supported in the intelligent storage tray, and being movable between an open state and a closed state;

a plurality of light pipes each associated with at least one of the reel holders and including a receiving end and a light emitting end;

a plurality of LEDs each positioned adjacent to the receiving end of a correspondingly aligned one of the plurality of light pipes;

the receiving end of each of the plurality of light pipes being structured for entry of light therethrough emitted from the adjacent one of the plurality of LEDs when the reel holder is in the closed state, thereby allowing for transmission of light from the light emitting end of the light pipe to indicate a status of the reel that is supported within the reel holder;

a plurality of sensors for detecting movement of the plurality of reel holders between the open state and the closed state, and the plurality of sensors communicating with system software for assigning a single SMT reel storage location to all of the reel holders that are moved from the open state to the closed state by placement of a single SMT reel on one or more of the reel holders;

at least one beacon on the at least one intelligent storage tray for indicating actions needed to be taken in connection with the at least one intelligent storage tray; and a printed circuit board on the at least one intelligent storage tray for controlling operation of the plurality of LEDs and communicating with the plurality of sensors.

7. The intelligent inventory storage system as in claim 6 further comprising:
at least one computer processor for communicating with the printed circuit board on the at least one intelligent storage tray.

8. The intelligent inventory storage system as in claim 7 further comprising:
at least one compression contact on the at least one intelligent storage tray for connecting the printed circuit board, the plurality of LEDs and the plurality of sensors to a power supply and a data connection to the at least one processor.

9. The intelligent inventory storage system as in claim 8 wherein the compression contact is operated to connect the printed circuit board, the plurality of LEDs and the plurality of sensors to the power supply and data connection upon placement of the at least one intelligent storage tray within a holder.

10. The intelligent inventory storage system as in claim 9 further comprising:
at least two spring pins on the opposite side walls of the at least one intelligent storage tray for locking the at least one intelligent storage tray to the holder.

* * * * *